United States Patent
Huang

(10) Patent No.: US 12,313,114 B2
(45) Date of Patent: May 27, 2025

(54) ROTATING SHAFT APPARATUS AND ELECTRONIC DEVICE

(71) Applicant: GUANGDONG OPPO MOBILE TELECOMMUNICATIONS CORP., LTD., Guangdong (CN)

(72) Inventor: Hongdong Huang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 307 days.

(21) Appl. No.: 18/066,746

(22) Filed: Dec. 15, 2022

(65) Prior Publication Data

US 2023/0124154 A1 Apr. 20, 2023

Related U.S. Application Data

(63) Continuation of application No. PCT/CN2021/095370, filed on May 24, 2021.

(30) Foreign Application Priority Data

Jul. 6, 2020 (CN) .......................... 202010642560.2

(51) Int. Cl.
*H05K 5/00* (2025.01)
*F16C 11/04* (2006.01)
(Continued)

(52) U.S. Cl.
CPC ............ *F16C 11/04* (2013.01); *G06F 1/1681* (2013.01); *H05K 5/0226* (2013.01); *E05D 3/02* (2013.01);
(Continued)

(58) Field of Classification Search
CPC ....... G06F 1/1681; H05K 5/0226; E05D 3/02; E05D 2011/1035; E05Y 2999/00; F16C 11/04
(Continued)

(56) References Cited

U.S. PATENT DOCUMENTS 6,474,734 B1 * 11/2002 Masuda ............... B60N 2/4214
297/216.13
2003/0183472 A1 * 10/2003 Nemoto ................. B60N 2/224
192/43.1
(Continued)

FOREIGN PATENT DOCUMENTS

| CN | 2319849 | 5/1999 |
| CN | 1293627 | 5/2001 |

(Continued)

OTHER PUBLICATIONS

WIPO, International Search Report and Written Opinion for PCT/CN2021/095370, Aug. 26, 2021.
(Continued)

*Primary Examiner* — Zhengfu J Feng
(74) *Attorney, Agent, or Firm* — Hodgson Russ LLP

(57) ABSTRACT

A rotating shaft apparatus and an electronic device are provided, which include a first rotating mechanism and a second rotating mechanism. The first rotating mechanism includes a first ratchet and a first tooth. The first tooth can rotate with respect to the first ratchet in a first rotation direction. An engagement structure between the first tooth and the first ratchet makes the first tooth stop rotating in a second rotation direction. The first and second rotation
(Continued)

directions are opposed. The second rotating mechanism is arranged coaxially with the first rotating mechanism, and includes a second ratchet and a second tooth. The second ratchet is in stop-rotation connection with the first tooth. The second tooth can rotate with respect to the second ratchet in the second rotation direction. An engagement structure between the second tooth and the second ratchet makes the second tooth stop rotating in the first rotation direction.

20 Claims, 9 Drawing Sheets

(51) Int. Cl.
    *G06F 1/16*     (2006.01)
    *H05K 5/02*     (2006.01)
    *E05D 3/02*     (2006.01)
    *E05D 11/10*     (2006.01)
(52) U.S. Cl.
    CPC .... *E05D 2011/1035* (2013.01); *E05D 11/105* (2013.01); *E05Y 2999/00* (2024.05)
(58) Field of Classification Search
    USPC ........................................................ 361/807
    See application file for complete search history.

(56) References Cited

U.S. PATENT DOCUMENTS

2005/0257447 A1* 11/2005 Bornemissza ........... G05G 5/06
                                                                                           52/127.1
2015/0090852 A1* 4/2015 Lin ........................ F16M 11/10
                                                                                           248/371

FOREIGN PATENT DOCUMENTS

| CN | 1932316 | 3/2007 |
|---|---|---|
| CN | 203689217 | 7/2014 |
| CN | 104006069 | 8/2014 |
| CN | 104514957 | 4/2015 |
| CN | 207245455 | 4/2018 |
| CN | 108024172 | 5/2018 |
| CN | 209540422 | 10/2019 |
| JP | 2001010386 | 1/2001 |

OTHER PUBLICATIONS

CNIPA, First Office Action for CN Application No. 202010642560. 2, Apr. 27, 2022.
CNIPA, Notification to Grant Patent Right for Invention for CN Application No. 202010642560.2, Sep. 9, 2022.
EPO, Extended European Search Report for EP Application No. 21837642.4, Oct. 30, 2023.

* cited by examiner

ROTATING SHAFT APPARATUS AND ELECTRONIC DEVICE

CROSS REFERENCE OF RELATED APPLICATIONS

This application is a continuation of International Application No. PCT/CN2021/095370, filed May 24, 2021, which claims priority to Chinese Patent Application No. 202010642560.2, filed Jul. 6, 2020. The entire disclosures of the above-identified applications are incorporated herein by reference.

TECHNICAL FIELD

The present disclosure relates to the field of consumer electronic devices, and in particularly, to a rotating shaft apparatus and an electronic device.

DESCRIPTION OF RELATED ART

With the development progress of science and technology, communication technology obtains rapid development and long-term progress. With the improvement of the communication technology, the popularization of intelligent electronic products is improved to an unprecedented height, and more and more intelligent terminals or electronic devices become an indispensable part of life of people, such as smart phones, smart televisions, and computers.

While the electronic devices are popularized, requirement of a user for display areas of the electronic devices is higher and higher, and requirement for screen-to-body ratios of the electronic devices is also relatively improved. In order to meet requirement of the user for large-screen display, a foldable electronic device should be transported. The foldable electronic device usually includes two electronic components and a rotating shaft connected between the two electronic components, and the two electronic components can rotate with respect to each other based on the rotating shaft. However, the two electronic components connected only by means of a rotating shaft move like a loose leaf in a rotating process. Only when the two electronic components rotate to a specific position (for example, an unfolded position at 180 degrees or a folded position at 0 degree), the two electronic components can be positioned relatively stably, and the two electronic components cannot maintain at a required angle between 0 and 180 degrees, thereby bringing inconvenience to the user.

SUMMARY

Embodiments of the present disclosure provide a rotating shaft apparatus and an electronic device.

In a first aspect, an embodiment of the present disclosure provides a rotating shaft apparatus, including: a first rotating mechanism, including a first ratchet and a first tooth engaged with the first ratchet; the first tooth being rotatable with respect to the first ratchet in a first rotation direction, an engagement structure between the first tooth and the first ratchet making the first tooth stop rotating with respect to the first ratchet in a second rotation direction, and the second rotation direction being opposited to the first rotation direction; and a second rotating mechanism, coaxially arranged with the first rotating mechanism and including a second ratchet and a second tooth engaged with the second ratchet; the second ratchet being in stop-rotation connection with the first tooth, the second tooth being rotatable with respect to the second ratchet in the second rotation direction, and an engagement structure between the second tooth and the second ratchet making the second tooth stop rotating with respect to the second ratchet in the first rotation direction.

In a second aspect, an embodiment of the present disclosure further provides an electronic device, including: a first housing, a second housing, and the rotating shaft apparatus above-mentioned, the first housing being connected to the first ratchet, and the second housing being connected to the second tooth.

In a third aspect, an embodiment of the present disclosure further provides an electronic device, including: a first housing, a second housing, and a rotating shaft apparatus; the rotating shaft apparatus being connected between the first housing and the second housing; the rotating shaft apparatus including: a first rotating mechanism, including a first ratchet and a first tooth; the first ratchet being connected to the first housing; the first tooth being rotatably connected to the first ratchet and being rotatable with respect to the first ratche in a first rotation direction; the first ratchet being provided with a plurality of positioning grooves in the first rotation direction; the first tooth being capable of being selectively accommodated in at least one of the plurality of positioning grooves, so as to make the first tooth stop rotating with respect to the first ratchet in a second rotation direction; and the second rotation direction being opposite to the first rotation direction; and a second rotating mechanism, arranged coaxially with the first rotating mechanism, and including a second ratchet and a second tooth engaged with the second ratchet; the second ratchet being connected to the second housing, the second ratchet being in stop-rotation connection with the first tooth; the second tooth being rotatable with respect to the second ratchet in the second rotation direction; and an engagement structure between the second tooth and the second ratchet being capable of making the second tooth stop rotating with respect to the second ratchet in the first rotation direction.

In the electronic device provided by the embodiment of the present disclosure, by arranging the first rotating mechanism and the second rotating mechanism which are substantially coaxial, the first housing and the second housing can rotate with respect to each other. Further, the first tooth and the first ratchet which are engaged with each other and the second tooth and the second ratchet which are engaged with each other are arranged. Specifically, the first tooth can rotate with respect to the first ratchet in the first rotation direction, the second tooth can rotate with respect to the second ratchet in the second rotation direction, the rotating shaft apparatus can be positioned and maintained at multiple angles in the rotation directions through the engagement structures of the teeth and the ratchets, the engagement structures are not prone to abrasion, engaging is stable, and the relative position between the first housing and the second housing of the electronic device can be maintained. Further, because the engagements of the teeth and the ratchets have the characteristic of limiting unidirectional rotation, the first tooth cannot rotate with respect to the first ratchet in the second rotation direction, the second tooth cannot rotate with respect to the second ratchet in the first rotation direction. Therefore, the two-way relative rotation of the first housing and the second housing is achieved through the two rotating mechanisms, while the phenomenon that the first housing and the second housing shake is avoided during the relative rotation process, and the positioning performance of the rotation angle of the rotating shaft apparatus is more durable and reliable.

BRIEF DESCRIPTION OF DRAWINGS

In order to illustrate technical solutions of the present disclosure more clearly, accompanying drawings required to be used in embodiments of the present disclosure are briefly described hereinafter. It is apparent that the accompanying drawings in the following description are merely some embodiments of the present disclosure, and those skilled in the art may obtain other drawings according to these accompanying drawings without any inventive effort.

DETAILED DESCRIPTION OF EMBODIMENTS

Figure 1:
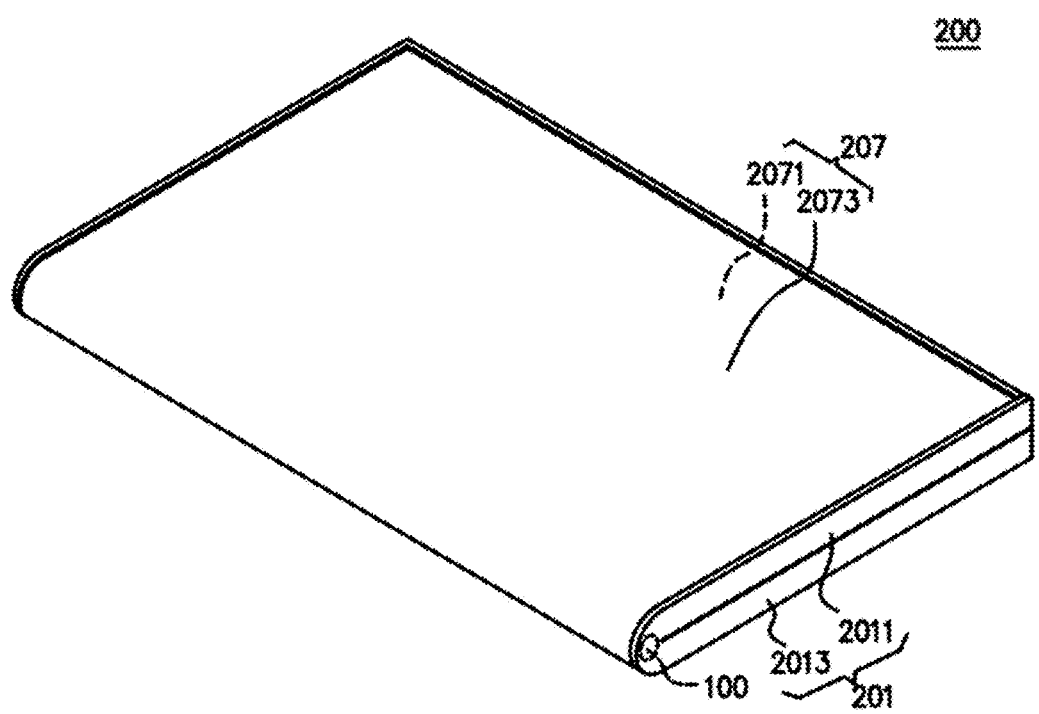
FIG. 1 illustrates a schematic perspective view of an electronic device according to an embodiment of the present disclosure.

Technical solutions of the embodiments of the present disclosure will be clearly and completely described below with reference to the accompanying drawings of the embodiments of the present disclosure. It is apparent that the described embodiments are merely part but not all of embodiments of the present disclosure. Based on the embodiments of the present disclosure, all other embodiments obtained by those skilled in the art without inventive effort also fall within the scope of protection of the present disclosure.

A term "electronic device" used in the embodiments of the present disclosure includes, but is not limited to, a device configured to receive/transmit communication signals via a wired line connection (such as via a public switched telephone network (PSTN), a digital subscriber line (DSL), a digital cable, a direct cable connection, and/or another data connection/network), and/or via a wireless interface (for example, a wireless interface of a cellular network, a wireless local area network (WLAN), a digital television network such as a Digital Video Broadcasting Handheld (DVB-H) network, a satellite network, an amplitude modulation-frequency modulation (AM-FM) broadcast transmitter, and/or another communication terminal). A communication terminal configured to perform communicating through a wireless interface may be called "a wireless communication terminal", "a wireless terminal", "an electronic apparatus", and/or "an electronic device". An example of the electronic device include, but is not limited to, a satellite or cellular phone; a personal communication system (PCS) terminal that can combine cellular radiotelephones with data processing, fax and data communication capabilities; a personal digital assistant (PDA) that can include a radiotelephone, a pager, an internet/intranet access, a web browser, a notebook, a calendar, and/or a global positioning system (GPS) receiver; as well as a conventional laptop and/or a palmtop receiver, a game machine or other electronic device including a radio telephone transceiver.

With the popularity of the electronic device nowadays, in order to meet the requirement of the user for large-screen display, a foldable electronic device appeared. The foldable electronic device usually includes two electronic components and a rotating shaft connected between the two electronic components. The two electronic components can rotate with respect to each other based on the rotating shaft. However, the two electronic components sway like a loose leaf in a process of rotation, and only when the two electronic components rotate to a specific position (for example, an unfolded position at 180 degrees or a folded position at 0 degree), the two electronic components can be positioned relatively stably, which brings inconvenience to the user.

In view of this, an inventor of the present disclosure studies how to enable the two electronic components to be positioned and maintained at several angles. Due to volume limitation of the electronic devices such as smart phones, there are not many hinges suitable for these electronic devices, and even fewer hinges can meet requirement. After a lot of research, the inventor put forward a rotating shaft apparatus with rotation damping, which uses a friction hinge to maintain an angle between two electronic components. However, after a lot of verification, the inventor further found that during a working process of the friction hinge, a relative angle between the two electronic components is maintained by a frictional force between two rotating friction pieces. After the two electronic components are rotated and folded for many times, the two rotating friction pieces are easily worn, which reduces the frictional force therebetween. With the increase of service time of the electronic device, the performance of the two rotating friction pieces for maintaining the relative position angle between the two electronic components decreases.

Therefore, the inventors of the present present disclosure continued to study how to improve the service life of the rotating shaft apparatus with rotation damping. The research of the inventor at least includes: with respect to a rotating shaft apparatus using a friction force to form damping, influence of a material of the friction piece on the service life of the rotating shaft apparatus; with respect to a rotating shaft apparatus using other forms of damping (such as damping fluid or a resilient hinge), influence of different forms of damping on the service life of the rotating shaft apparatus; and influence of different rotating shaft matching structures on the service life of the rotating shaft apparatus. After a lot of repeated research, the inventor proposed a rotating shaft apparatus and an electronic device of the present disclosure. The rotating shaft apparatus includes a first rotating mechanism and a second rotating mechanism, which are arranged substantially coaxially. The first rotating mechanism includes a first ratchet and a first tooth engaged with the first ratchet. The first tooth can rotate with respect to the first ratchet in a first rotation direction. An engagement structure between the first tooth and the first ratchet makes the first tooth stop rotating with respect to the first ratchet in a second rotation direction. The second rotation direction is opposite to the first rotation direction. The second rotating mechanism includes a second ratchet and a second tooth engaged with the second ratchet. The second ratchet is in stop-rotation connection with the first tooth. The second tooth can rotate with respect to the second ratchet in the second rotation direction. An engagement structure between the second tooth and the second ratchet can make the second tooth stop rotating with respect to the second ratchet in the first rotation direction. The electronic device includes a first housing, a second housing, and the rotating shaft apparatus above-mentioned. The first housing is connected to the first rotating mechanism, the second housing is connected to the second rotating mechanism, and the first housing and the second housing can rotate relatively through the first rotating mechanism and the second rotating mechanism.

In the electronic device provided according to an embodiment of the present disclosure, the first housing and the second housing can rotate with respect to each other by providing the first rotating mechanism and the second rotating mechanism substantially coaxially. Further, since the electronic device is provided with the first tooth and the first ratchet engaged with each other, and the second tooth and a second ratchet engaged with each other, the first tooth can rotate with respect to the first ratchet in the first rotation direction, and the second tooth can rotate with respect to the second ratchet in the second rotation direction, through the engagement structures among the teeths and the ratchets, it is possible to achieve multiple angular positioning and maintaining of the rotating shaft apparatus in the rotation directions, and these engagement structures are not easy to wear and stable in engagement, which is beneficial to maintain the relative position between the first housing and the second housing of the electronic device. Furthermore, since the engagement among the teeth and the ratchets has the characteristic of restricting one-way rotation, the first tooth cannot rotate back with respect to the first ratchet in the second rotation direction, and the second tooth cannot rotate back with respect to the second ratchet in the first rotation direction; further, a two-way relative rotation of the first housing and the second housing is realized through the two rotating mechanisms, the phenomenon that the first housing and the second housing shake during the relative rotation process is effectively avoided, and the positioning performance of the rotation angle of the rotating shaft apparatus is more durable and reliable.

The technical solutions of the embodiments of the present disclosure will be clearly and completely described hereinafter with reference to the accompanying drawings of the embodiments of the present disclosure.

Referring to FIG. 1, an embodiment of the present disclosure provides an electronic device 200 having a rotating shaft apparatus 100. The electronic device 200 may be, but is not limited to, an electronic device such as a mobile phone, a tablet computer, and a game machine. The electronic device 200 according to the embodiments of the present disclosure is described by taking a mobile phone as an example.

In the embodiment of the present disclosure, the electronic device 200 includes a rotating shaft apparatus 100, a foldable housing assembly 201, a display module 207, and an electronic assembly (not shown). The electronic assembly is arranged in the foldable housing assembly 201. The display module 207 is arranged on the foldable housing assembly 201. The rotating shaft apparatus 100 is connected to the foldable housing assembly 201, such that the foldable housing assembly 201 can be folded or unfolded based on the rotating shaft apparatus 100. The foldable housing assembly 201 is configured to both carry the display module 207 and protect the electronic assembly. It should be noted that in the specification of the present disclosure, when one component is considered to be "arranged on" the another component, it means that the one component may be connected to or directly arranged on another component, or there may be a further component between the one and another components; and when one component is considered to be "connected to" another component, it means that the one component may be directly connected to the another component, or there may be a further component between the one and another components.

The foldable housing assembly 201 may include a first housing 2011 and a second housing 2013. The first housing 2011 and the second housing 2013 are respectively connected to two opposite sides of the rotating shaft apparatus 100. The second housing 2013 can be folded or unfolded with respect to the first housing 2011 through the rotating shaft apparatus 100, so that the foldable housing assembly 201 can drive the display module 207 to be folded or unfolded. When the foldable housing assembly 201 and the display module 207 are folded and closed, a volume of the electronic device 200 is relatively small, which is convenient for storage and carrying.

The electronic assembly may include a first electronic module, a second electronic module, and a flexible circuit board. The first electronic module is arranged in the first housing 2011, the second electronic module is arranged in the second housing 2013, and the flexible circuit board is electrically connected to the first electronic module and the second electronic module. Further, the first electronic module may be a motherboard, and a central processing unit, a memory, an antenna, a camera, and a receiver arranged on the motherboard. The second electronic module may also include a printed circuit board and a functional module arranged on the printed circuit board. The second electronic module is different from the first electronic module, and the second electronic module may include a battery, a connector, a fingerprint module, and the like.

The display module 207 is arranged on the foldable housing assembly 201. Further, the display module 207 is laid on the first housing 2011, the rotating shaft apparatus 100, and the second housing 2013. In an embodiment of the present disclosure, the display module 207 has a bendable flexible portion, so that the display module 207 can be in a folded state or an unfolded state when the first housing 2011 and the second housing 2013 are turned over. The display module 207 is electrically connected to the electronic component, so that the electronic component can control a display content of the display module 207 and obtain interactive information through the display module 207.

In an embodiment of the present disclosure, the display module 207 may include a display panel 2071 and a cover plate 2073. The cover plate 2073 is stacked on a side of the display panel 2071. Further, the display panel 2071 is a flexible display screen, and the cover plate 2073 is a flexible cover plate and covers a display side of the display panel 2071 for protecting the display panel 2071 from scratches, corrosion and other damages.

In an embodiment of the present disclosure, the display panel 2071 is an active matrix organic light emitting diode (AMOLED) display panel. As a self-luminous display panel, the AMOLED display panel is not required to be provided with a back light module (BLM), as such, when a base substrate of the AMOLED display panel is made of a flexible resin material, such as polyethylene terephthalate (PET), the AMOLED display panel can have a bendable characteristic.

Figure 2:
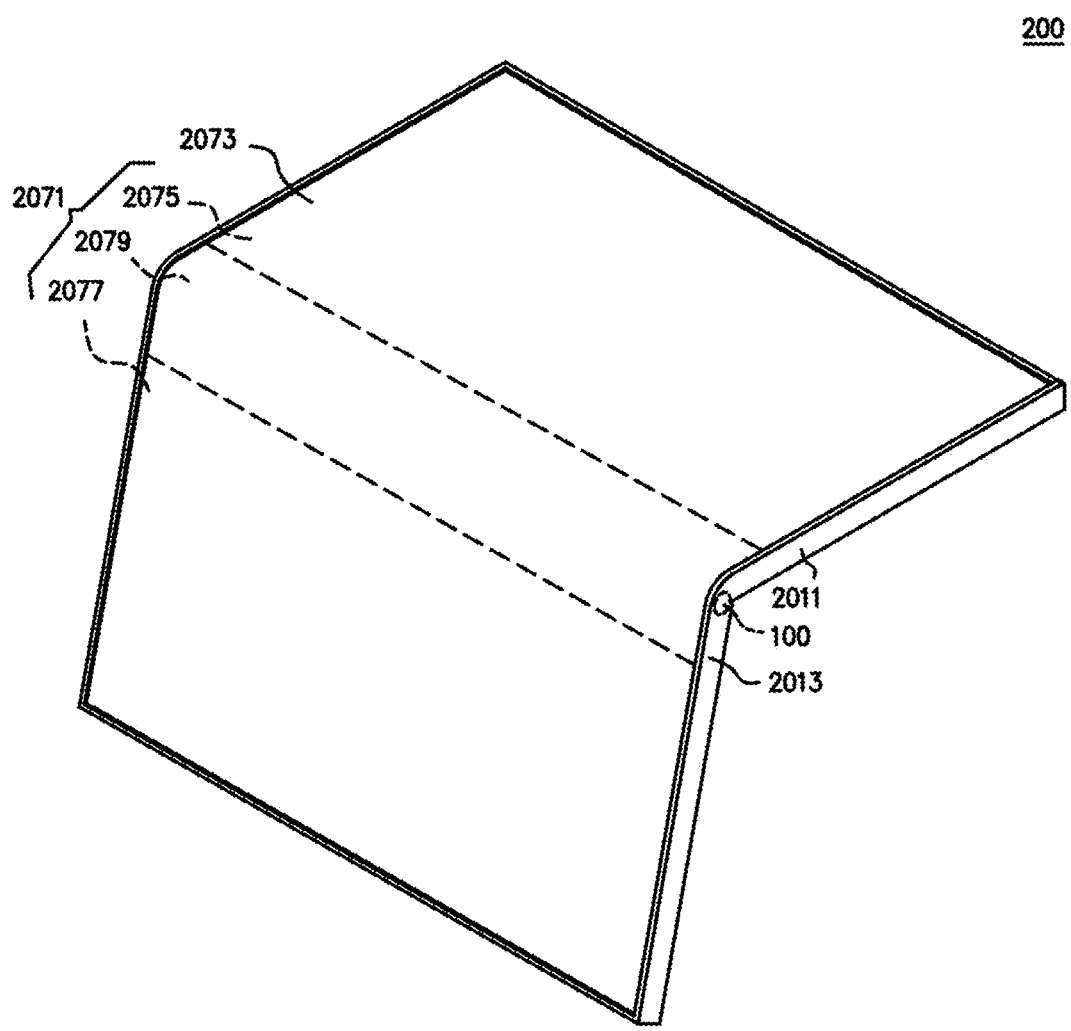
FIG. 2 illustrates a schematic perspective view of the electronic device of FIG. 1 in a partially expanded state.

The display panel 2071 has a flexible portion, which can make the display panel 2071 be folded or unfolded through the flexible portion. Referring to FIG. 2, in an embodiment of the present disclosure, the display panel 2071 includes a first plane portion 2075, a second plane portion 2077, and a flexible display portion 2079. The flexible display portion 2079 is connected between the first plane portion 2075 and the second plane portion 2077. When the display module 207 is connected to the foldable housing assembly 201, the first plane portion 2075 is stacked on the first housing 2011, the second plane portion 2077 is stacked on the second housing 2013, and the flexible display portion 2079 is generally arranged to correspond to a position where the rotating shaft apparatus 100 is located. The first plane portion 2075 and the second plane portion 2077 can be relatively folded or unfolded along with relative folding or unfolding of the first housing 2011 and the second housing 2013, respectively. The flexible display portion 2079 can be bent or flattened along with relative folding or unfolding of the first plane portion 2075 and the second plane portion 2077.

In some other embodiments of the present disclosure, the first plane portion 2075, the second plane portion 2077, and the flexible display portion 2079 may be an integrated structure, such that the display module 207 is a monolithic flexible display panel. Alternatively, the flexible display portion 2079 is a bendable flexible portion, and the first plane portion 2075 and the second plane portion 2077 may be non-flexible portions, and the first plane portion 2075 and the second plane portion 2077 are relatively folded or unfolded through the flexible display portion 2079.

In an embodiment of the present disclosure, when the first housing 2011 and the second housing 2013 are in a folded and closed state, the first plane portion 2075 faces away from the second plane portion 2077, and the flexible display portion 2079 faces outside and is substantially located at a side portion of the folded electronic device 200, such that the electronic device 200 is presented as a structure of a outward-folded screen, and the user can observe a display content of the display module 207 in the case of folding, thereby the electronic device 200 has high convenience. It can be understood that when the first housing 2011 and the second housing 2013 are in the folded and closed state, the first plane portion 2075 and the second plane portion 2077 may also be stacked facing to each other, and the flexible display portion 2079 is in a folded state and is accommodated inside the folded electronic device 200, such that the electronic device 200 is presented as a structure of an inward-folded screen, and thus the display module 207 is prevented from being scratched and damaged.

It should be understood that the naming of the first plane portion, the second plane portion, and the flexible display portion is merely for convenience of description, and is not used for the structural limitation of the foldable screen. In an actual application scenario, the first plane portion, the second plane portion, and the flexible display portion may have no obvious limit. Alternatively, the foldable screen may have other division structure, for example, the foldable screen may include a first plane portion and a second plane portion connected to the first plane portion, and the first plane portion and the second plane portion can rotate with respect to each other to be folded or unfolded.

In the electronic device 200 provided in the embodiment of the present disclosure, since the electronic device 200 includes the first housing 2011 and the second housing 2013 being capable of being foldable with respect to the first housing 2011, and the first plane portion 2075 and the second plane portion 2077 corresponding respectively to the first housing 2011 and the second housing 2013, the electronic device 200 is presented as a foldable electronic device that may be folded. It can be understood that the electronic device 200 may further include a third housing and a corresponding third plane portion (not shown), a side of the third housing is rotatably connected to the first housing 2011, another side is rotatably connected to the second housing 2013, the third plane portion is laid on the third housing and connected between the first plane portion 2075 and the second plane portion 2077, as such, both the first housing 2011 and the second housing 2013 can rotate with respect to the third housing, and both the first plane portion 2075 and the second plane portion 2077 can be folded with respect to the third plane portion, so that the electronic device 200 is presented as a triple-folded electronic device that can be folded twice. It may be understood that the third housing and the third plane portion thereon may be arranged at other positions, for example, the third housing may be rotatably connected to a side of the first housing 2011 facing away from the second housing 2013, or the third housing may be rotatably connected to a side of the second housing 2013 facing away from the first housing 2011. Similarly, it can be understood that the electronic device 200 may further include more housings and display portions, such that the electronic device 200 is presented as an electronic device having a structure, which can be folded more times, and thus the electronic device 200 has a small storage volume on the premise of ensuring that the electronic device 200 has a large display area, thereby facilitating storage and carrying of the electronic device 200.

Figure 3:
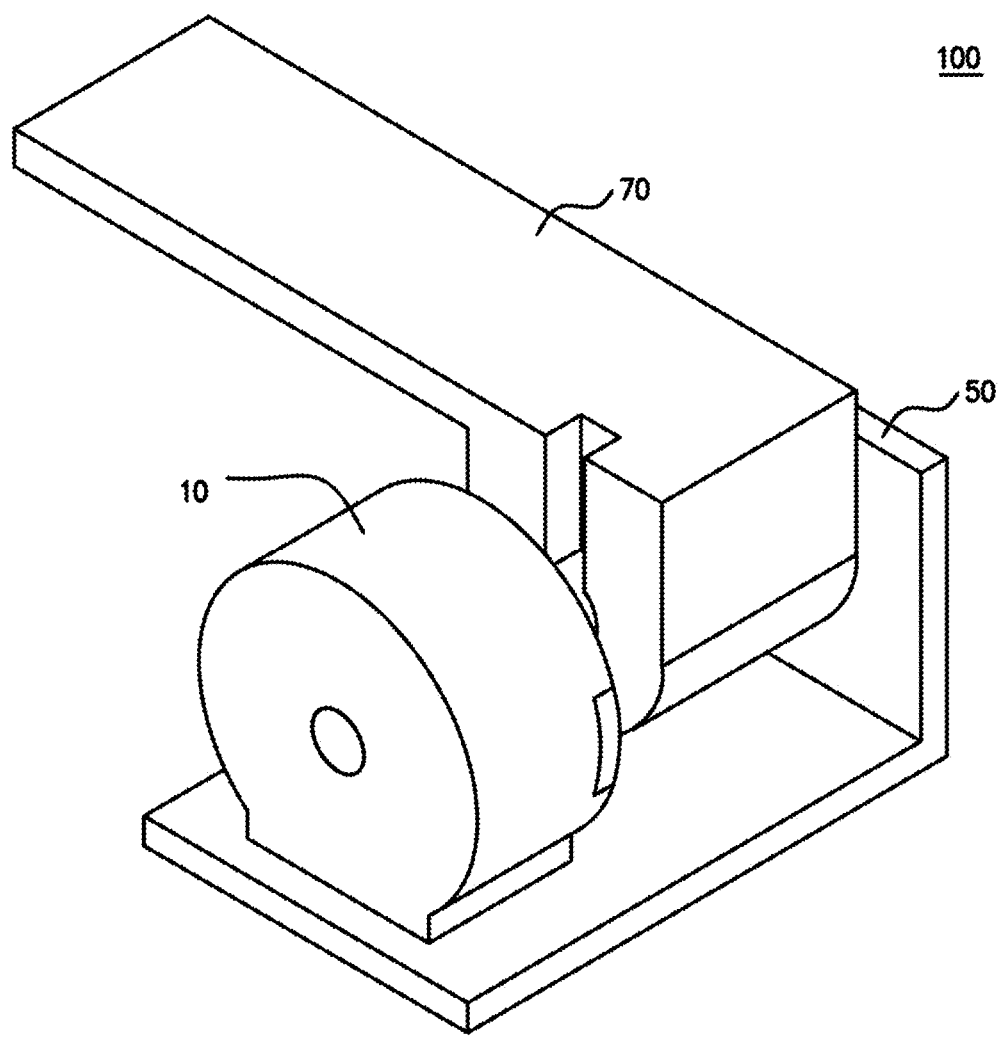
FIG. 3 illustrates a schematic perspective view of a rotating shaft apparatus of the electronic device of FIG. 2.
Figure 4:
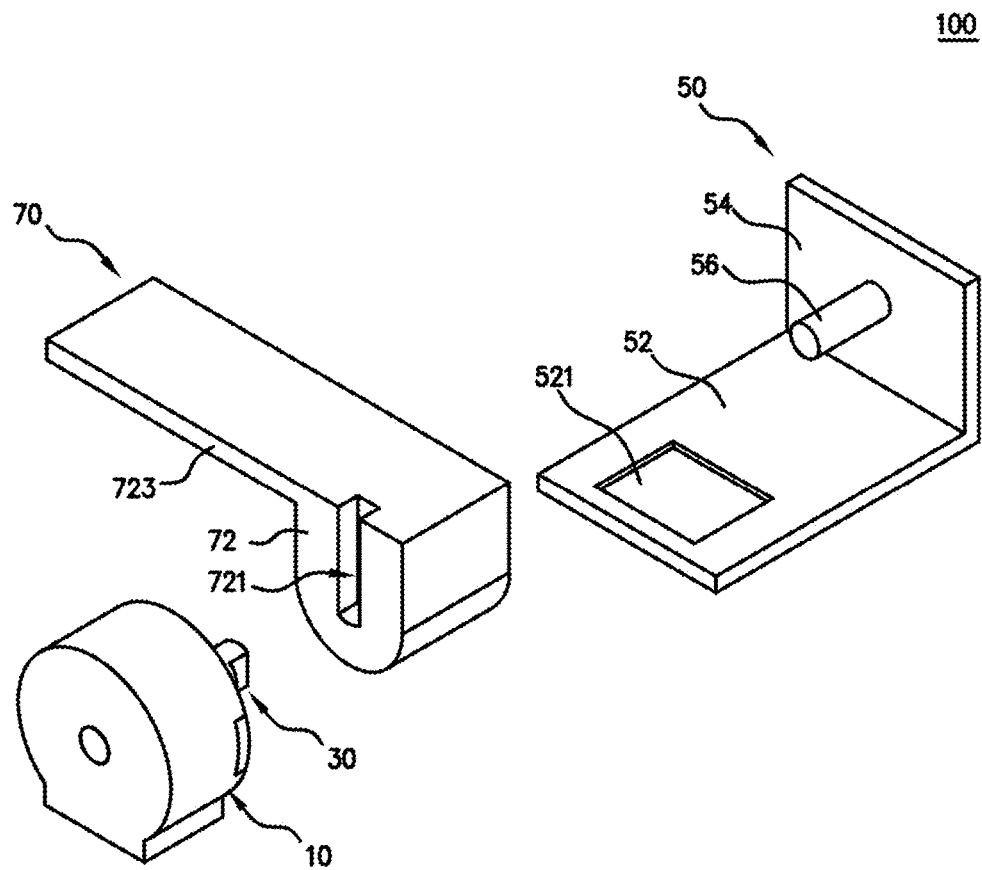
FIG. 4 illustrates a schematic perspective exploded view of the rotating shaft apparatus of FIG. 3.

Referring to FIGS. 3 and 4, the rotating shaft apparatus 100 includes a first rotating mechanism 10 and a second rotating mechanism 30. The first rotating mechanism 10 and the second rotating mechanism 30 are arranged substantially coaxially and can rotate with respect to each other, the first rotating mechanism 10 is connected to the first housing 2011, and the second rotating mechanism 30 is connected to the second housing 2013, such that the first housing 2011 and the second housing 2013 can rotate based on relative rotation between the first rotating mechanism 10 and the second rotating mechanism 30. Further, the rotating shaft apparatus 100 may further include a mounting base 50 and a driving member 70. The mounting base 50 is configured to carry the first rotating mechanism 10 and the second rotating mechanism 30. The driving member 70 is connected to the second rotating mechanism 30 and is configured to drive the first rotating mechanism 10 and the second rotating mechanism 30 to rotate.

Specifically, in an embodiment shown in FIG. 4, the mounting base 50 is fixed in the foldable housing assembly 201 and connected to the first housing 2011. The mounting base 50 includes a mounting portion 52, and a supporting portion 54, and the connecting shaft 56. The mounting portion 52 is substantially plate-shaped, and is fixed with respect to the first housing 2011. The mounting portion 52 is provided with a mounting groove 521. The mounting groove 521 is configured for mounting the first rotating mechanism 10. The mounting groove 521 is recessed with respect to a surface of the mounting portion 52 to position the first rotating mechanism 10, which can reduce the volume of the rotating shaft apparatus 100 to a certain extent, and is beneficial to thinness of the electronic device 200. The supporting portion 54 is substantially plate-shaped. The supporting portion 54 is arranged at an end of the mounting portion 52, and is adjacent to the mounting groove 521. In an embodiment of the present disclosure, the supporting portion 54 is substantially perpendicular to the mounting portion 52, so as to define a mounting space together with the mounting portion 52 for accommodating the first rotating mechanism 10 and the second rotating mechanism 30. The connecting shaft 56 is connected to a side of the supporting portion 54 facing the mounting portion 52. In an embodiment of the present disclosure, the connecting shaft 56 is approximately parallel to the mounting portion 52, and is configured for mounting the driving member 70.

The driving member 70 is rotatably sleeved onto the connecting shaft 56, and is connected between the second housing 2013 and the second rotating mechanism 30. When the second housing 2013 rotates with respect to the first housing 2011, the second housing 2013 drives the second rotating mechanism 30 to rotate with respect to the mounting base 50 and the first rotating mechanism 10 through the driving member 70. In an embodiment of the present disclosure, the driving member 70 includes a rotating portion 72 and a driving portion 74. The rotating portion 72 is rotatably sleeved onto the connecting shaft 56, and is configured to connect the second rotating mechanism 30. The driving portion 74 is connected to the rotating portion 72. The driving portion 74 protrudes with respect to the rotating portion 72, for connecting to the second housing 2013.

Further, in an embodiment of the present disclosure, the rotating portion 72 is substantially block-shaped, and opposite two sides of the rotating portion 72 are respectively provided with a insertion slot 721 and an adapter hole (not shown). The adapter hole is substantially a circular hole, which is arranged on a side of the rotating portion 72 facing towards the supporting portion 54 and is rotatably sleeved onto the connecting shaft 56, such that the rotating portion 72 can rotate with respect to the mounting base 50 based on rotating fit between the adapter hole and the connecting shaft 56. The insertion slot 721 is arranged on a side of the rotating portion 72 facing away from the supporting portion 54. In an embodiment of the present disclosure, the insertion slot 721 is a roughly square slot, and the insertion slot 721 passes through an end of the rotating portion 72, which is facilitated to insert a component of the second rotating mechanism 30 therein and to drive the second rotating mechanism 30 to rotate.

In other embodiments of the present disclosure, the insertion slot 721 may be other shapes, for example, a dovetail groove or the like. The insertion slot 721 may also be a hole shape, for example, a triangular hole, a rectangular hole, an elliptical hole, or other non-circular holes such as a polygonal hole, so as to be in stop-rotation connection with the second rotating mechanism 30, and thereby drive the second rotating mechanism 30 to rotate when the rotating portion 72 rotates.

In an embodiment of the present disclosure, the driving portion 74 is substantially plate-shaped. The driving portion 74 is connected to a side of the rotating portion 72, and protrudes with respect to the rotating portion 72, which is facilitated to be connected to the second housing 2013. When an external force is applied on the driving portion 74 to generate a turning moment, the driving portion 74 can drive the rotating portion 72 to rotate relative to the mounting base 50, and while the rotating portion 72 rotates, the rotating portion 72 drives the second rotating mechanism 30 to rotate based on the insertion slot 721.

Figure 5:
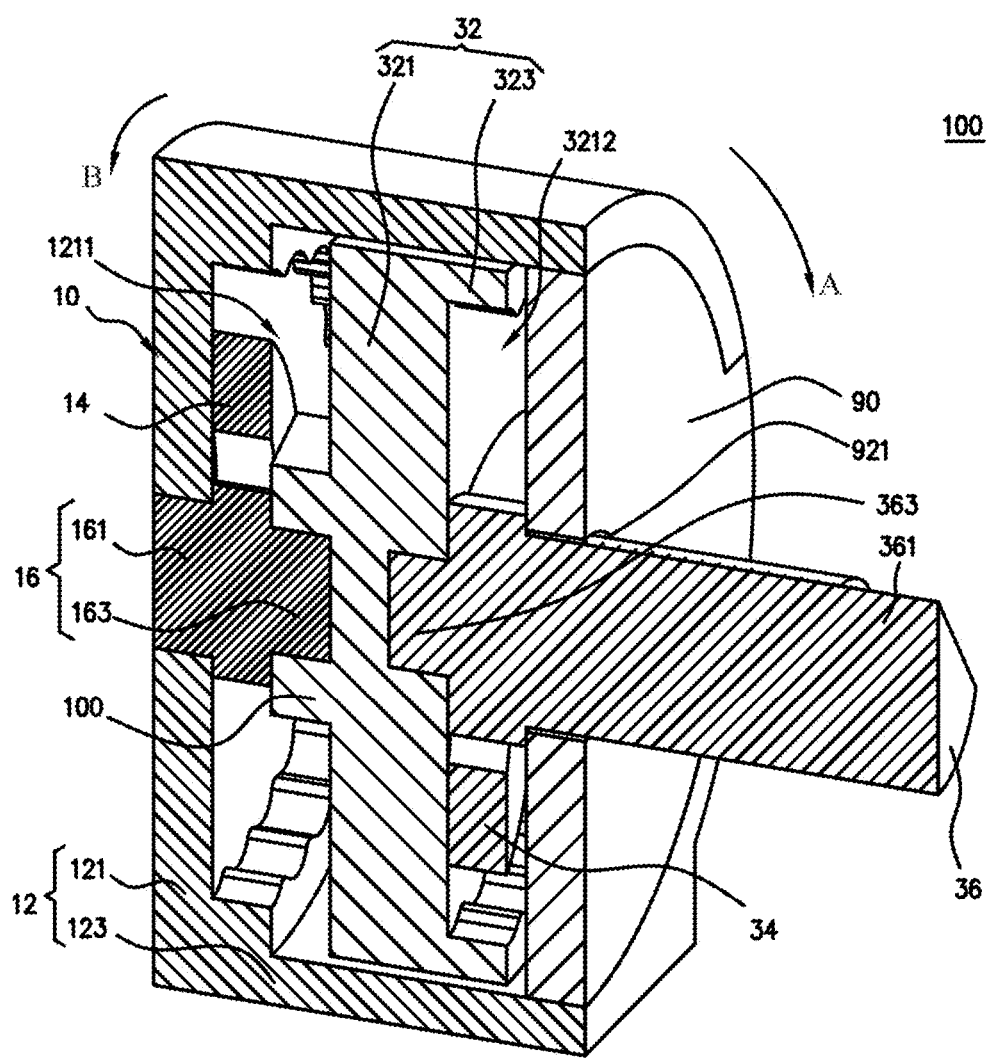
FIG. 5 illustrates a schematic perspective cross-sectional view of the rotating shaft apparatus of FIG. 3.
Figure 6:
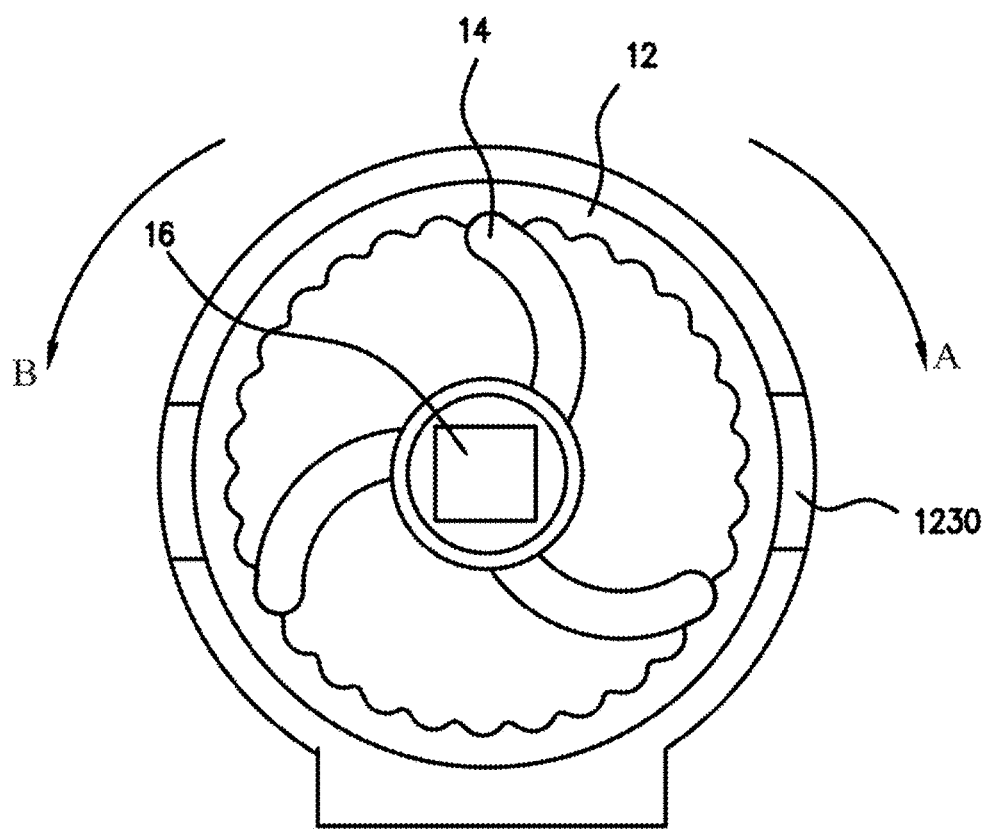
FIG. 6 illustrates a schematic orthographic projection view of a first rotating mechanism of the rotating shaft apparatus of FIG. 5.

Referring to FIGS. 5 and 6, the first rotating mechanism 10 is mounted onto the mounting portion 52 of the mounting base 50. The first rotating mechanism 10 includes a first ratchet 12 and a first tooth 14 engaged with each other. The first ratchet 12 can rotate with respect to the first tooth 14 in a first rotation direction A, and an engagement structure between the first tooth 14 and the first ratchet 12 make the first tooth 14 stop rotating with respect to the first ratchet 12 in a second rotation direction B. The second rotation direction B is opposite to the first rotation direction A. It should be understood that, in this specification, if a first component is in "stop-rotation" with respect to a second component in a certain direction, which should means that due to the limitation of a cooperation structure of the two components, the first component cannot rotate in the certain direction with respect to the second component, for example, if the first component rotates in the certain direction, the first and second components should satisfy relative static.

Figure 7:
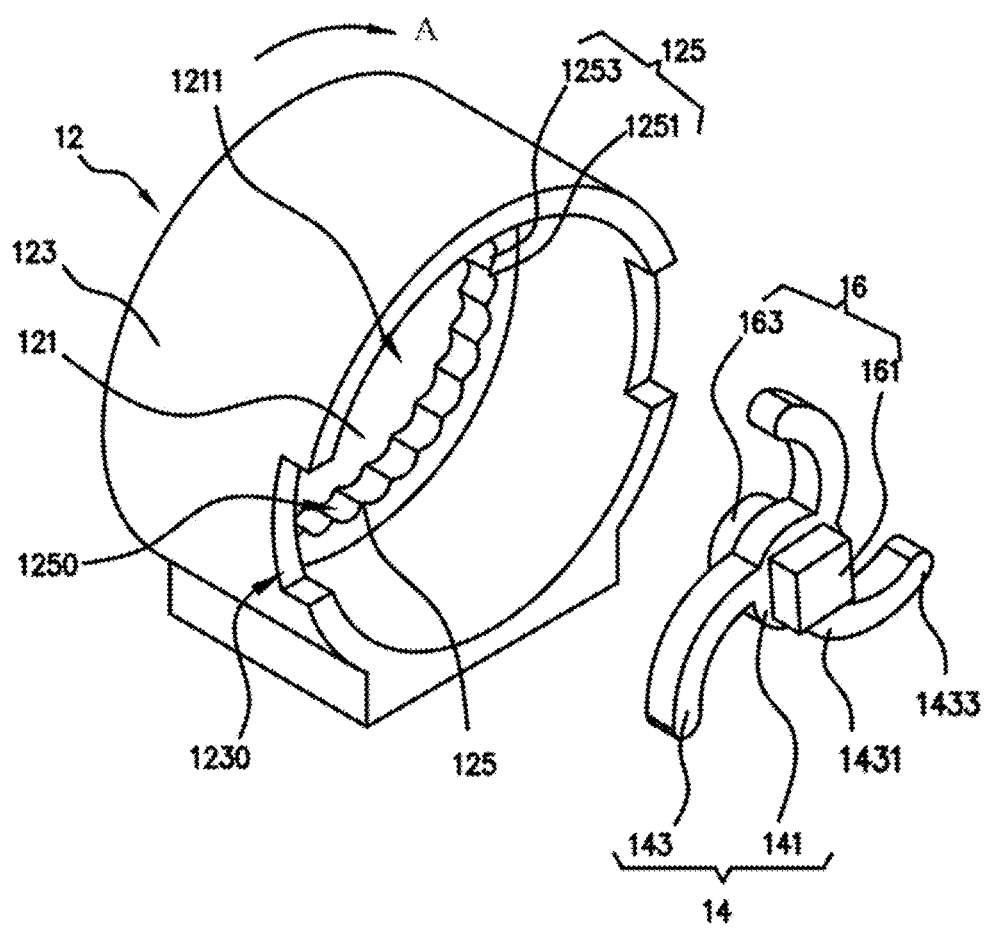
FIG. 7 illustrates a schematic perspective exploded view of the first rotating mechanism of the rotating shaft apparatus of FIG. 5.

Referring to FIG. 7, in an embodiment of the present disclosure, the first ratchet 12 includes a first turntable portion 121, a first peripheral wall 123, and first positioning teeth 125. The first turntable portion 121 is substantially disc-shaped. The first peripheral wall 123 is substantially annular or cylindrical. The first peripheral wall 123 surrounds a periphery of the first turntable portion 121 and is fixed in the mounting groove 521 of the mounting base 50. The first peripheral wall 123 and the first turntable portion 121 together form an accommodating space 1211, and the accommodating space 1211 is configured to receive the first tooth 14.

The first positioning teeth 125 are arranged on a side of the first peripheral wall 123 facing towards the accommodating space 1211. In an embodiment of the embodiments, the first positioning teeth 125 are multiple in number, and the multiple first positioning teeth 125 are sequentially arranged at intervals in a circumferential direction of the first peripheral wall 123, and are substantially uniformly distributed. A distance between each two adjacent first positioning teeth 125 of the multiple first positioning teeth 125 is approximately equal, and each two adjacent first positioning teeth 125 jointly define one first positioning groove 1250. The first positioning teeth 125 arranged in sequence define multiple first positioning grooves 1250 for selectively accommodating the first tooth 14, so as to realize the engagement between the first tooth 14 and the first ratchet 12. In other embodiments of the present disclosure, the first positioning grooves 1250 may be directly recessed and formed in the first peripheral wall 123, rather than providing the first positioning teeth 125 protruding with respect to the first peripheral wall 123. In other embodiments of the present disclosure, and the first turntable portion 121 may also be omitted, and the first peripheral wall 123 is directly fixed onto the mounting base 50.

Further, in the embodiment shown in FIG. 7, each of the first positioning teeth 125 includes a first surface 1251 and a second surface 1253 facing away from each other, and both the first surface 1251 and the second surface 1253 are cambered surfaces. The first surface 1251 of each of the first positioning teeth 125 is smoothly connected to the second surface 1253 of another first positioning tooth 125 which adjoins the first positioning tooth 125, so that each first positioning groove 1250 has an arc-shaped groove structure, and thus the first tooth 14 moves smoothly in the first positioning groove 1250.

In other embodiments of the present disclosure, the first surface 1251 and the second surface 1253 may also be planar. In the circumferential direction of the first peripheral wall 123, referring to the first rotation direction A, the first surface 1251 is located in front of the second surface 1253, and an included angle between the first surface 1251 and a diameter of the first peripheral wall 123 is smaller than an included angle between the second surface 1253 and the diameter of the first peripheral wall 123. For example, a plane of the first surface 1251 is approximately parallel to the diameter of the first peripheral wall 123, and is shown to have a substantially vertical blocking structure; while a plane of the second surface 1253 intersects with the diameter of the first peripheral wall 123, and is shown to have an inclined plane-like guiding structure, so that when the first tooth 14 moves in the first positioning groove 1250, the first tooth 14 can only move in a direction of the first surface 1251 along an inclined plane of the second surface 1253, but cannot cross the first surface 1251, thus effectively ensuring that the first tooth 14 stops rotating with respect to the first ratchet 12 in the second rotation direction B.

In an embodiment of the present disclosure, the first rotating mechanism 10 may further include a first rotating shaft 16. The first rotating shaft 16 is arranged in the accommodating space 1211, and is configured to mount the first tooth 14. The first rotating shaft 16 includes a stop-rotation portion 161 and a rotating portion 163. The stop-rotation portion 161 and the rotating portion 163 are arranged substantially coaxially and connected to each other. The stop-rotation portion 161 is a non-circular shaft, and is configured to be in stop-rotation connection with the second rotating mechanism 30. Specifically, the stop-rotation portion 161 may be a non-cylindrical shaft such as a square shaft, a triangular shaft, a polygonal shaft, and an elliptical shaft, so as to achieve a stop-rotation connection function thereof. The rotating portion 163 is substantially a circular shaft, and is arranged at an end of the stop-rotation portion 161 close to the first turntable portion 121. The rotating portion 163 is rotatably inserted into the first turntable portion 121 to ensure high stability when the first tooth 14 rotates with respect to the first ratchet 12.

The first tooth 14 is mounted onto the first rotating shaft 16, to rotate with respect to the first ratchet 12 under the driving of the first rotating shaft 16. In an embodiment of the present disclosure, the first tooth 14 may include a first mounting portion 141 and a first tooth portion 143. The first mounting portion 141 is connected to the first rotating shaft 16, and is fixed with respect to the first rotating shaft 16. Further, the first mounting portion 141 is substantially annular, and is arranged between the stop-rotation portion 161 and the rotating portion 163.

The first tooth portion 143 is connected to the first mounting portion 141, and is received in the accommodating space 1211. An end of the first tooth portion 143 away from the first mounting portion 141 is selectively accommodated in the multiple first positioning grooves 1250. In an embodiment of the present disclosure, the first tooth portion 143 is a resilient rod, which can generate resilient deformation to move in some first positioning grooves 1250 through some first positioning teeth 125. Further, the first tooth portion 143 is a resilient arc-shaped rod, and when the first tooth 14 rotates in the first rotation direction A, an arc convex side of the arc-shaped rod is located in front of an arc concave side thereof. Specifically, the first tooth portion 143 includes a connecting end 1431 connected to the first mounting portion 141 and a free end 1433 facing away from the first mounting portion 141. An extending direction of an arc-shaped structure of the first tooth portion 143 from the free end 1433 to the connecting end 1431 is the same as the first rotation direction A, such that when the first tooth portion 143 moves in the first positioning groove 1250, the first tooth portion 143 can only move along the second surface 1253 towards the first surface 1251 (that is, in the first rotation direction A), but cannot reverse over the first surface 1251, thus effectively ensuring that the first tooth 14 stops rotating with respect to the first ratchet 12 in the second rotation direction B.

In an embodiment of the present disclosure, the first tooth portion 143 may be three in number. The three first tooth portions 143 are evenly distributed on a periphery of the first mounting portion 141, and are engaged with the first ratchet 12 individually, so as to ensure that a relative movement of the first tooth 14 relative to the first ratchet 12 has high stability. In other embodiments of the present disclosure, the first tooth portion 143 may be one, two, or more than two in number, which is not limited thereto in the specification. In addition, in other embodiments of the present disclosure, if the first positioning tooth 125 is provided with an inclined plane-like guiding structure and a straight plane blocking structure, the first tooth portion 143 may be a straight rod with certain elasticity.

In an embodiment of the present disclosure, the first tooth 14 and the first rotating shaft 16 may be made as a integrally formed connecting structure, and the first tooth 14 and the first rotating shaft 16 can be prepared by processes such as stamping and die-casting. The first tooth 14 is made of a material having a certain resilient deformation capability, for example, the first tooth 14 may be a metal rod made of metal, or a plastic rod made of plastic.

In other embodiments of the present disclosure, a connection between the first tooth 14 and the first rotating shaft 16 may be achieved through assembling, for example, after the first tooth 14 and the first rotating shaft 16 are respectively formed, the first mounting portion 141 is sleeved onto the first rotating shaft 16.

The second rotating mechanism 30 is partially arranged in the accommodating space 1211 formed by the first peripheral wall 123 of the first rotating mechanism 10, and is connected to the driving member 70, to rotate under the driving of the driving member 70. The second rotating mechanism 30 includes a second ratchet 32 and a second tooth 34, which are engaged with each other. The second ratchet 32 can rotate with respect to the second tooth 34 in the second rotation direction B, and an engagement structure between the second tooth 34 and the second ratchet 32 make the second tooth 34 stop rotation with respect to the second ratchet 32 in the first rotation direction A.

In an embodiment of the present disclosure, a structure of the second ratchet 32 is substantially the same as that of the first ratchet 12, and the second ratchet 32 includes a second turntable portion 321, a second peripheral wall 323, and second positioning teeth 325

Figure 8:
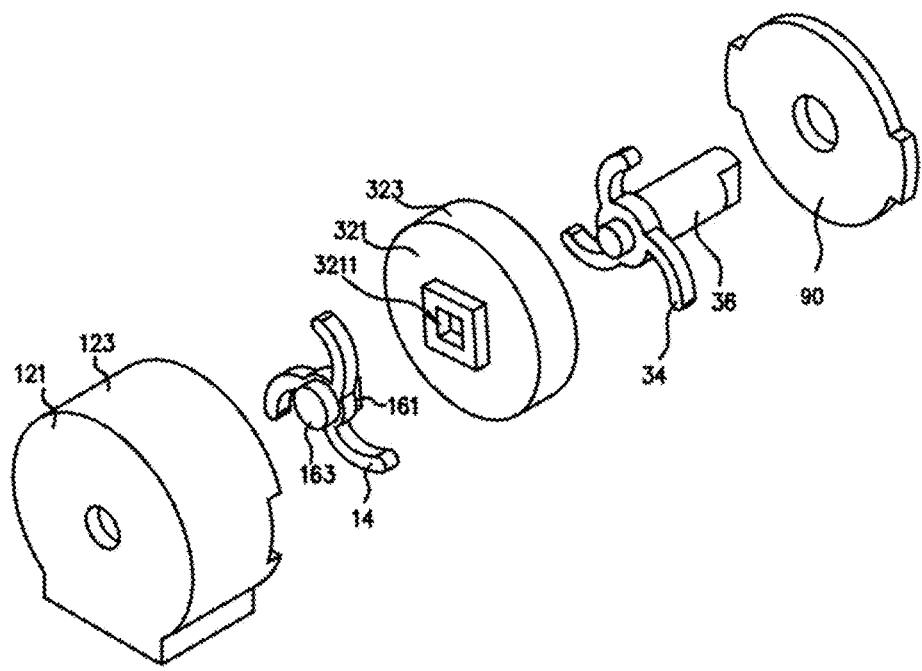
FIG. 8 illustrates a schematic perspective exploded view of the rotating shaft apparatus of FIG. 5.

Referring to FIG. 8, the second turntable portion 321 is substantially disc-shaped. The second turntable portion 321 is received in the accommodating space 1211, and is arranged substantially parallel to the first turntable portion 121. An side of the second turntable portion 321 facing toward the first turntable portion 121 is provided with a connecting hole 3211. A shape of the connecting hole 3211 matches the shape of the stop-rotation portion 161 of the first rotating shaft 16, and the stop-rotation portion 161 of the first rotating shaft 16 is at least partially accommodated in the connecting hole 3211, so as to achieve the stop-rotation connection between the first rotating mechanism 10 and the second rotating mechanism 30. Specifically, the connecting hole 3211 may be a non-circular hole such as a square hole, a triangular hole, a polygonal hole and an elliptical hole, so as to achieve the function of the stop-rotation connection thereof.

Figure 9:
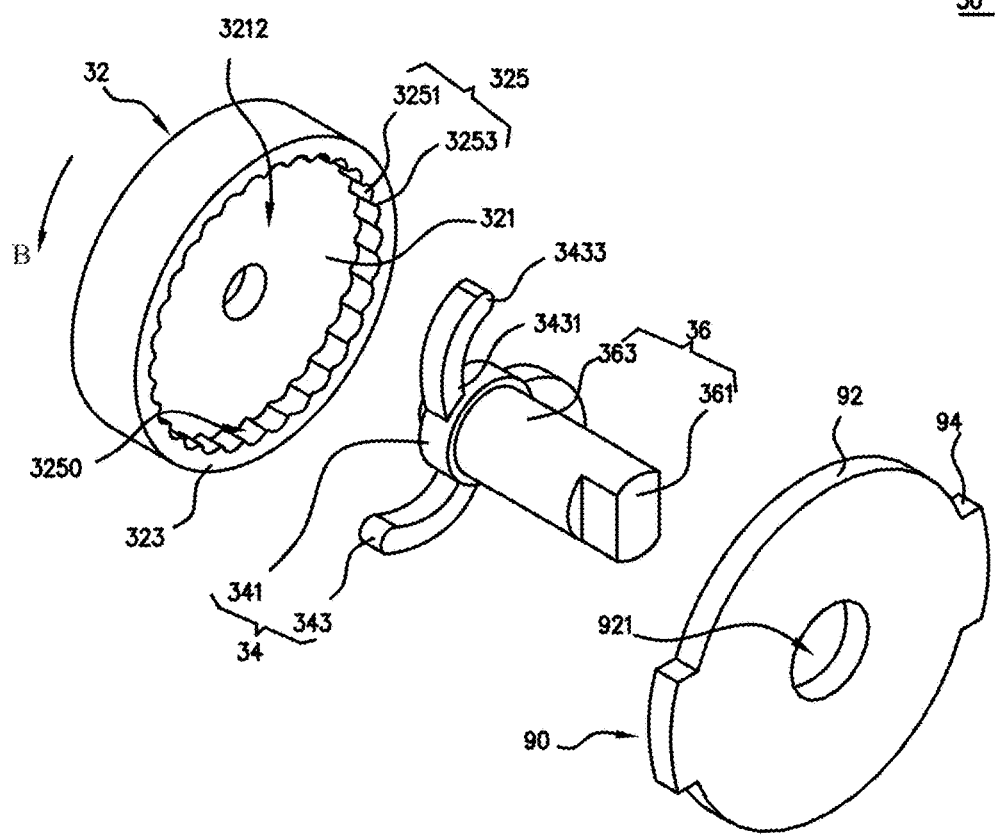
FIG. 9 illustrates a schematic perspective exploded view of a second rotating structure of the rotating shaft apparatus of FIG. 5.

Referring to FIG. 9, the second peripheral wall 323 is substantially annular or cylindrical. The second peripheral wall 323 surrounds a periphery of the second turntable portion 321, and is fixed in the mounting groove 521 (shown in FIG. 4) of the mounting base 50. The second peripheral wall 323 and the second turntable portion 321 together form an accommodating space 3212, and the accommodating space 3212 is configured to receive the second tooth 34

The second positioning teeth 325 are arranged on a side of the second peripheral wall 323 facing the accommodating space 3212. In an embodiment of the present disclosure, there are multiple second positioning teeth 325, and the multiple second positioning teeth 325 are sequentially arranged at intervals in a circumferential direction of the second peripheral wall 323, and are substantially uniformly distributed. A distance between each two adjacent second positioning teeth 325 of the multiple second positioning teeth 325 is approximately equal, and each two adjacent second positioning teeth 325 jointly define one second positioning groove 3250. The multiple second positioning teeth 325 arranged in sequence define multiple second positioning grooves 3250 for selectively accommodating the second tooth 34, so as to realize the engagement between the second tooth 34 and the second ratchet 32.

Further, in the embodiment shown in FIG. 9, each of the second positioning teeth 325 includes a first surface 3251 and a second surface 3253 facing away from each other, both the first surface 3251 and the second surface 3253 are cambered surfaces. The first surface 3251 of each of the second positioning teeth 325 is smoothly connected to the second surface 3253 of another second positioning tooth 325 which adjoins the second positioning tooth 325, so that each second positioning groove 3250 has an arc-shaped groove structure, and thus the second tooth 34 moves smoothly in the second positioning groove 3250.

In other embodiments of the present disclosure, the first surface 3251 and the second surface 3253 may also be planar. In the circumferential direction of the second peripheral wall 323, referring to the first rotation direction B, the first surface 3251 is located in front of the second surface 3253, and an included angle between the first surface 3251 and a diameter of the second peripheral wall 323 is smaller than an included angle between the second surface 3253 and the diameter of the second peripheral wall 323. For example, a plane of the first surface 3251 is approximately parallel to the diameter of the second peripheral wall 323, and is shown to have a substantially vertical blocking structure; while a plane of the second surface 3253 intersects with the diameter of the second peripheral wall 323, and is shown to have an inclined plane-like guiding structure, so that when the second tooth 34 moves in the second positioning groove 3250, the second tooth 34 can only move in a direction of the first surface 3251 along an inclined plane of the second surface 3253, but cannot cross the first surface 3251, thus effectively ensuring that the second tooth 34 stops rotating with respect to the second ratchet 32 in the second rotation direction B.

In an embodiment of the present disclosure, the second rotating mechanism 30 may further include a second rotating shaft 36. The second rotating shaft 36 is arranged on a side of the second ratchet 32 away from the first rotating shaft 16, and is configured to mount the second tooth 34. The second rotating shaft 36 includes a stop-rotation portion 361 and a rotating portion 363. The stop-rotation portion 361 and the rotating portion 363 are generally coaxially arranged and connected to each other. The stop-rotation portion 361 is a non-circular shaft, and is configured to be be in stop-rotation connection with the driving member 70. A shape of the stop-rotation portion 361 matches the shape of the insertion slot 721 of the driving member 70, and the stop-rotation portion 361 is at least partially accommodated in the insertion slot 721, to rotate with the driving member 70. Specifically, the stop-rotation portion 361 may be a non-cylindrical shaft such as a dovetail shaft, a square shaft, a triangular shaft, a polygonal shaft, and an elliptical shaft, so as to achieve a stop-rotation connection function thereof. The rotating portion 363 is substantially a circular shaft, and is arranged at an end of the stop-rotation portion 361 close to the second turntable portion 321. The rotating portion 363 is rotatably inserted into the second turntable portion 321 to ensure high stability when the second tooth 34 rotates with respect to the second ratchet 32. The rotating portion 363 is inserted into the second turntable portion 321, and the stop-rotation portion 361 protrudes from the accommodating space 2312 to facilitate connection with the driving member 70.

The second tooth 34 is mounted onto the second rotating shaft 36, to rotate with respect to the second ratchet 32 under the driving of the second rotating shaft 36. In an embodiment of the present disclosure, the second tooth 34 may include a second mounting portion 341 and a second tooth portion 343. The second mounting portion 341 is connected to the second rotating shaft 36, and is fixed with respect to the second rotating shaft 36. Further, the second mounting portion 341 is substantially annular and surrounds an periphery of the rotating portion 363.

The second tooth portion 343 is connected to the second mounting portion 341, and is received in the accommodating space 3212. An end of the second tooth portion 343 away from the second mounting portion 341 is selectively accommodated in the multiple second positioning grooves 3250. In an embodiment of the present disclosure, the second tooth portion 343 is a resilient rod, which can generate resilient deformation to move in some second positioning grooves 3250 through some second positioning teeth 325. Further, the second tooth portion 343 is a resilient arc-shaped rod, and when the second tooth 34 rotates in the second rotation direction B, an arc convex side of the arc-shaped rod is located in front of an arc concave side thereof. Specifically, the second tooth portion 343 includes a connecting end 3431 connected to the second mounting portion 341 and a free end 3433 facing away from the second mounting portion 341. An extending direction of an arc-shaped structure of the second tooth portion 343 from the free end 3433 to the connecting end 3431 is the same as the first rotation direction B, such that when the second tooth portion 343 moves in the second positioning groove 3250, the second tooth portion 343 can only move along the second surface 3253 towards the first surface 3251 (that is, in the second rotation direction B), but cannot reverse over the first surface 3251, thus effectively ensuring that the second tooth 34 stops rotating with respect to the second ratchet 32 in the second rotation direction A.

In an embodiment of the present disclosure, the second tooth portion 343 may be three in number. The three second tooth portions 343 may be evenly distributed on a periphery of the second mounting portion 341, and are engaged with the second ratchet 32 individually, so as to ensure that a relative movement of the second tooth 34 respect to the second ratchet 32 has high stability. In other embodiments of the present disclosure, the second tooth portion 343 may be one, two, or more than two in number, which is not limited thereto in the specification. In addition, in other embodiments of the present disclosure, if the second positioning tooth 325 is provided with an inclined plane-like guiding structure and a straight plane blocking structure, the second tooth portion 343 may be a straight rod with certain elasticity.

In this embodiment, the second tooth 34 and the second rotating shaft 36 may be made as a integrally formed connecting structure, and the second tooth 34 and the second rotating shaft 36 can be prepared by processes such as stamping and die-casting. The second tooth 34 is made of a material having a certain resilient deformation capability, for example, the second tooth 34 may be a metal rod made of metal, or a plastic rod made of plastic.

In other embodiments of the present disclosure, a connection between the second tooth 34 and the second rotating shaft 36 may be achieved through assembling, for example, after the second tooth 34 and the second rotating shaft 36 are respectively formed, the second mounting portion 341 is sleeved onto the second rotating shaft 36.

In an embodiment of the present disclosure, the rotating shaft apparatus 100 may further include a sealing cover 90. The sealing cover 90 is sleeved onto the second rotating shaft 36 and is connected to the first peripheral wall 123, so as to encapsulate the first rotating mechanism 10 and the second rotating mechanism 30 into a modular structure, and thus to facilitate the assembly of the rotating shaft apparatus 100. Further, the sealing cover 90 includes a body 92 and positioning portions 94. The body 92 has a substantially circular plate shape, and a positioning hole 921 is formed at an approximate middle portion of the body 92. The body 92 is sleeved onto the rotating portion 363 of the second rotating shaft 36 through the positioning hole 921 and covers an opening of the first peripheral wall 123. In an embodiment of the present disclosure, the positioning portions 94 are two in number, and the two positioning portions 94 are connected to opposite sides of the body 92, respectively, and protrude from the body 92 in radial directions of the body 92. The positioning portions 94 are used to cooperate with the first peripheral wall 123 to enable the sealing cover 90 to be firmly mounted on the first peripheral wall 123. Further, referring again to FIG. 7, an end of the first peripheral wall 123 away from the first turntable portion 121 is provided with positioning notches 1230. When the body 92 covers the opening of the first peripheral wall 123, the positioning portions 94 are accommodated in the positioning notches 1230, respectively, so as to prevent the sealing cover 90 from rotating relative to the first peripheral wall 123, and make the structure of the rotating shaft apparatus 100 more stable.

Referring again to FIGS. 4 and 5, when the rotating shaft apparatus 100 provided by the embodiment of the present disclosure is assembled, first, the assembled first tooth 14 and the assembled first rotating shaft 16 are placed into the accommodating space 1211 of the first peripheral wall 123, and the rotating portion 163 of the first rotating shaft 16 is rotatably inserted into the first turntable portion 121, so that the first tooth 14 is engaged with the first ratchet 12. Secondly, the second turntable portion 321 of the second rotating mechanism 30 is placed into the accommodating space 1211, so that the second turntable portion 321 is sleeved onto the stop-rotation portion 161 of the first rotating shaft 16 through the connecting hole 3211, and then the assembled second tooth 34 and the assembled second rotating shaft 36 are placed in the accommodating space 3212 of the second peripheral wall 323, the rotating portion 363 of the second rotating shaft 36 is rotatably inserted into the second turntable portion 321, so that the second tooth 34 is engaged with the second ratchet 32. Then, the sealing cover 90 is sleeved onto the second rotating shaft 36 through the positioning hole 921, and covers the accommodating space 1211 of the first peripheral wall 123, as such, the first rotating mechanism 10 and the second rotating mechanism 30 are assembled. Finally, the driving member 70 is rotatably mounted on the connecting shaft 56 of the mounting base 50, and the stop-rotation portion 361 of the second rotating shaft 36 is inserted into the insertion slot 721 of the driving member 70, so that the first peripheral wall 123 is fixed in the mounting groove 521 of the mounting base 50.

The mounting base 50 of the rotating shaft apparatus 100 is connected to the first housing 2011 of the electronic device 200, and the driving member 70 is connected to the second housing 2013. When the first housing 2011 rotates with respect to the second housing 2013 in the first rotation direction A, the first housing 2011 drives the second rotating shaft 36 to rotate through the driving member 70, in this case, since the second tooth 34 stops rotating with respect to the second ratchet 32 in the first rotation direction A, the second rotating shaft 36 drives the second tooth 34 to push the second ratchet 32 to rotate in the first rotation direction A, and since the second ratchet 32 is in stop-rotation connection with the first rotating shaft 16, the second ratchet 32 drives the first rotating shaft 16 to rotate in the first rotation direction A, so that the first tooth 14 rotates with respect to the first ratchet 12 in the first rotation direction A. Because of the engagement structure between the first tooth 14 and the first ratchet 12, the first tooth 14 can stay at the required rotation angle without reversing when rotating relative to the first ratchet 12.

Similarly, when the first housing 2011 rotates with respect to the second housing 2013 in the second rotation direction B, the first housing 2011 drives the second rotating shaft 36 and the second tooth 34 to rotate through the driving member 70, in this case, since the second tooth 34 is rotatable with respect to the second ratchet 32 in the second rotation direction B, the second tooth 34 does not drive the second ratchet 32 or the first rotating shaft 16 to rotate, but the second tooth 34 is engaged and rotated on the second positioning teeth 325 of the second ratchet 32 in turn. Because of the engagement structure between the second tooth 34 and the second ratchet 32, the second tooth 34 can stay at a required rotation angle without reversing when rotating relative to the second ratchet 32.

Therefore, in the electronic device provided by the embodiment of the present disclosure, by arranging the first rotating mechanism and the second rotating mechanism which are substantially coaxial, the first housing and the second housing can rotate with respect to each other. Further, the first tooth and the first ratchet which are engaged with each other and the second tooth and the second ratchet which are engaged with each other are arranged. Specifically, the first tooth can rotate with respect to the first ratchet in the first rotation direction, the second tooth can rotate with respect to the second ratchet in the second rotation direction, the rotating shaft apparatus can be positioned and maintained at multiple angles in the rotation directions through the engagement structures of the teeth and the ratchets, the engagement structures are not prone to abrasion, engaging is stable, and the relative position between the first housing and the second housing of the electronic device can be maintained. Further, because the engagements of the teeth and the ratchets have the characteristic of limiting unidirectional rotation, the first tooth cannot rotate with respect to the first ratchet in the second rotation direction, the second tooth cannot rotate with respect to the second ratchet in the first rotation direction. Therefore, the two-way relative rotation of the first housing and the second housing is achieved through the two rotating mechanisms, while the phenomenon that the first housing and the second housing shake is avoided during the relative rotation process, and the positioning performance of the rotation angle of the rotating shaft apparatus is more durable and reliable.

Based on the rotating shaft apparatus and the electronic device, an embodiment of the present disclosure further provides a further electronic device, which including a first housing, a second housing and a rotating shaft apparatus, the first housing is connected to a first ratchet, and the second housing is connected to a second ratchet. The rotating shaft apparatus is connected between the first housing and the second housing. The rotating shaft apparatus includes a first rotating mechanism and a second rotating mechanism. The first rotating mechanism includes a first ratchet and a first tooth. The first ratchet is connected with the first housing. The first tooth is rotatably connected to the first ratchet and can rotate with respect to the first ratchet in the first rotation direction. The first ratchet is provided with multiple positioning grooves in the first rotation direction, and the first tooth can be selectively accommodated in at least one of the positioning grooves, so that the first tooth stops rotating with respect to the first ratchet in a second rotation direction, and the second rotation direction is opposite to the first rotation direction. The second rotating mechanism is coaxially arranged with the first rotating mechanism, and includes a second ratchet and a second tooth engaged with the second ratchet. The second ratchet is connected to the second housing. The second ratchet is in stop-rotation connection with the first tooth. The second tooth can rotate with respect to the second ratchet in the second rotation direction. An engagement structure between the second tooth and the second ratchet can prevent the second tooth from rotating with respect to the second ratchet in the first rotation direction.

Figure 10:
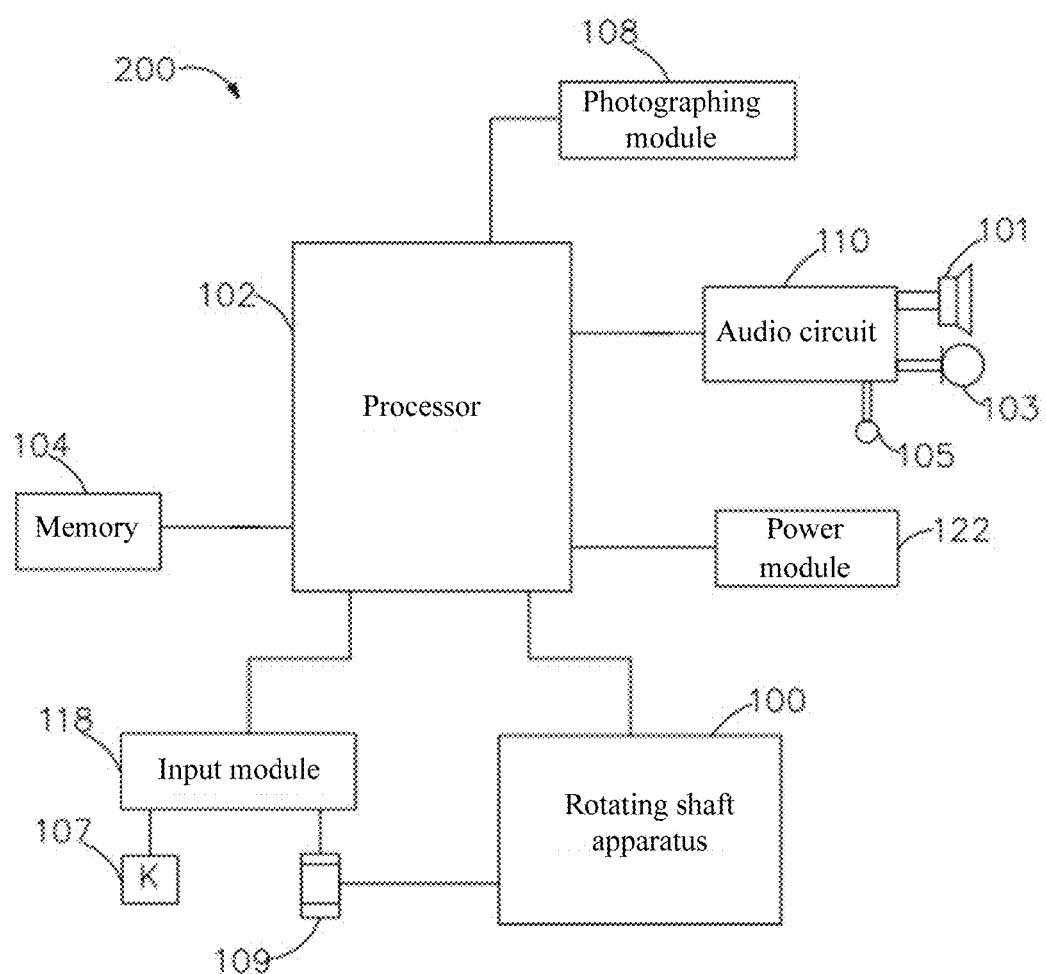
FIG. 10 illustrates a functional block diagram of an electronic device according to an embodiment of the present disclosure.

Referring to FIG. 10, in an actual application scenario, the electronic device 200 provided in the embodiments of the present disclosure may be used as a smart phone terminal, and in this case, the electronic device 200 generally further includes one component or more same components (only one shown in FIG. 10), which may include: a processor 102, a memory 104, a photographing module 108, an audio circuit 110, an input module 118, a power module 122, and one or more applications. Specifically, the one or more applications may be stored in the memory 104 and configured to be executed by the one or more processors 102. A person of ordinary skilled in the art may understand that the structure shown in FIG. 10 is merely illustrative, and does not define the structure of the electronic device 200. For example, the electronic device 200 may also include more or fewer components than that shown in FIG. 10, or have a different configuration than that shown in FIG. 10.

The photographing module 108 may be a camera, which is arranged on the foldable housing assembly 201 for performing a photographing task, for example, for photographing a photo, a video, or performing a videophone call, etc. The audio circuit 110, the speaker 101, the sound jack 103, and the microphone 105 together provide an audio interface between a user and the electronic device 200. In an embodiment of the present disclosure, the input module 118 may include a physical button 107, a touch screen 109 arranged on the display module 207, or the like. The touch screen 109 may collect a touch operation on or near the touch screen 109 by the user (for example, the user uses any suitable object or accessory such as a finger or a stylus to operate on the touch screen 109 or near the touch screen 109), and may drive a corresponding connecting device according to a preset program.

The display module 207 is configured to display information input by the user, information provided to the user, and various graphical user interfaces of the electronic device 200. The graphical user interfaces may be composed of graphics, text, icons, numbers, videos, and any combination thereof. In an example, the touch screen 109 may be arranged on the display module 207 so as to form a whole with the display module 207.

The power module 122 is configured to provide power supply to the processor 102 and other components. Specifically, the power module 122 may include a power management device, one or more power supplies (such as batteries or alternating currents), a charging circuit, a power failure detection circuit, an inverter, a power state indicator, and other components related to the generation, management and distribution of power in an electronic component or the display module 207.

It should be understood that the above-mentioned electronic device 200 is not limited to the smart phone terminal, but refers to a computer device that can be used during movement. Specifically, the electronic device 200 refers to a mobile computer device equipped with an intelligent operating device, the electronic device 200 includes, but is not limited to, a smart phone, a smart watch, a notebook, a tablet computer, a point of sale (POS) machine, or even a vehicle-mounted computer, etc.

In the specification, the specific features or characteristics described may be combined in any suitable manner in any one or more embodiments or examples. In addition, those skilled in the art can combine different embodiments or examples and features of different embodiments or examples described in the specification without contradicting each other. Finally, it should be explained that the above embodiments are merely used to illustrate the technical solutions of the present disclosure, but not to limit thereto. Although the present disclosure has been described in detail with reference to the aforementioned embodiments, it should be understood by those skilled in the art that it is also possible to modify the technical solutions described in the aforementioned embodiments, or equivalently replace some technical features thereof. These modifications or substitutions do not make the essence of the corresponding technical solutions deviate from the spirit and scope of the technical solutions of the embodiments of the present disclosure.

What is claimed is:

1. A rotating shaft apparatus, comprising:
   a first rotating mechanism, comprising a first ratchet and a first tooth engaged with the first ratchet; the first tooth being rotatable with respect to the first ratchet in a first rotation direction, an engagement structure between the first tooth and the first ratchet making the first tooth stop rotating with respect to the first ratchet in a second rotation direction, and the second rotation direction being opposite to the first rotation direction; and
   a second rotating mechanism, coaxially arranged with the first rotating mechanism and comprising a second ratchet and a second tooth engaged with the second ratchet; the second ratchet being in stop-rotation connection with the first tooth, the second tooth being rotatable with respect to the second ratchet in the second rotation direction, and an engagement structure between the second tooth and the second ratchet making the second tooth stop rotating with respect to the second ratchet in the first rotation direction;
   wherein the rotating shaft apparatus further comprises a mounting base and a driving member, the driving member is rotatably connected to the mounting base, and the first ratchet is fixed to the mounting base, and the second tooth is in stop-rotation connection with the driving member;

wherein the first tooth is configured to rotate, under driving of the driving member, with respect to the first ratchet in the first rotation direction, thereby changing a relative angle between the mounting base and the driving member through engagement between the first tooth and the first ratchet; and the second tooth is configured to rotate, under driving of the driving member, with respect to the second ratchet in the second rotation direction, thereby changing the relative angle between the mounting base and the driving member through engagement between the second tooth and the second ratchet.

2. The rotating shaft apparatus according to claim 1, wherein the first rotating mechanism further comprises a first rotating shaft, and the first tooth is arranged onto the first rotating shaft;

wherein the second rotating mechanism further comprises a second rotating shaft, and the second tooth is arranged onto the second rotating shaft; and wherein the first rotating shaft and the second rotating shaft are respectively arranged at two opposite sides of the second ratchet, the first rotating shaft is in stop-rotation connection with the second ratchet; and the second rotating shaft is in rotation connection with the second ratchet.

3. The rotating shaft apparatus according to claim 2, wherein the first ratchet comprises a first peripheral wall, the first peripheral wall extends to form an accommodating space, a side of the first peripheral wall facing towards the accommodating space is provided with a plurality of positioning grooves, the first tooth is accommodated in the accommodating space, and an end portion of the first tooth is capable of being selectively accommodated in the plurality of positioning grooves.

4. The rotating shaft apparatus according to claim 3, wherein the first ratchet further comprises a first turntable portion and a plurality of positioning teeth, the first turntable portion is arranged at an end of the first peripheral wall, the first rotating shaft is rotatably connected to the first turntable portion, the plurality of positioning teeth are arranged at intervals in a circumferential direction of the first peripheral wall, and each two adjacent positioning teeth of the plurality of positioning teeth are provided a corresponding one positioning groove of the plurality of positioning grooves therebetween.

5. The rotating shaft apparatus according to claim 4, wherein each of the plurality of positioning teeth comprises a first surface and a second surface opposite to each other, the first surface and the second surface are both cambered surfaces, and the first surface of each of the plurality of positioning teeth is smoothly connected to the second surface of another positioning tooth of the plurality of positioning teeth adjoining the positioning tooth.

6. The rotating shaft apparatus according to claim 4, wherein the first peripheral wall is annular, each of the plurality of positioning teeth comprises a first surface and a second surface opposite to each other, each of the first surface and the second surface is planar, and an included angle between the first surface and a diameter of the first peripheral wall is smaller than an included angle between the second surface and the diameter of the first peripheral wall; and wherein a plane where the first surface is located is parallel to the diameter of the first peripheral wall; and a plane where the second surface is located intersects with the diameter of the first peripheral wall, and has an inclined plane shape.

7. The rotating shaft apparatus according to claim 4, wherein the first rotating shaft comprises a stop-rotation portion and a rotating portion, the stop-rotation portion and the rotating portion are coaxially arranged and connected with each other, the rotating portion is arranged at an end of the stop-rotation portion proximate to the first turntable portion, the rotating portion is rotatably inserted into the first turntable portion, and the stop-rotation portion is in stop-rotation connection with the second ratchet.

8. The rotating shaft apparatus according to claim 4, wherein the second ratchet is arranged in the accommodating space, the second ratchet comprises a second turntable portion and a second peripheral wall surrounding the second turntable portion, the second peripheral wall is provided with a plurality of positioning grooves, and an end of the second tooth is capable of being selectively accommodated in the plurality of positioning grooves of the second ratchet.

9. The rotating shaft apparatus according to claim 8, wherein the second rotating shaft protrudes from the accommodating space; and wherein the rotating shaft apparatus further comprises a sealing cover, and the sealing cover is arranged at an end of the first peripheral wall facing away from the first turntable portion and is sleeved onto the second rotating shaft.

10. The rotating shaft apparatus according to claim 9, wherein the sealing cover comprises a body and positioning portions, a middle portion of the body is provided with a positioning hole, the body is sleeved onto the second rotating shaft through the positioning hole, the positioning portions are connected to the body and protrude with respect to the body in a radial direction of the body, the first peripheral wall is provided with positioning notches, and the positioning portions are accommodated in the positioning notches, respectively.

11. The rotating shaft apparatus according to claim 2, wherein the first tooth comprises a first mounting portion and a first tooth portion, the first mounting portion is connected to the first rotating shaft, the first tooth portion is connected to the first mounting portion, the first tooth portion is a resilient rod, and an end of the first tooth portion facing away from the first mounting portion is capable of being selectively accommodated in a plurality of positioning grooves of the first ratchet; and wherein the first tooth portion is an arc-shaped rod; and when the first tooth rotates in the first rotation direction, an arc convex side of the arc-shaped rod is located in front of an arc concave side of the arc-shaped rod.

12. The rotating shaft apparatus according to claim 2, wherein the second tooth comprises a second mounting portion and a second tooth portion, the second mounting portion is connected to the second rotating shaft, the second tooth portion is connected to the second mounting portion, the second tooth portion is a resilient rod, and an end of the second tooth portion facing away from the second mounting portion is capable of being selectively accommodated in a plurality of positioning grooves of the second ratchet.

13. The rotating shaft apparatus according to claim 12, wherein the second tooth portion is an arc-shaped rod; and when the second tooth rotates in the second rotation direction, an arc convex side of the arc-shaped rod is located in front of an arc concave side of the arc-shaped rod.

14. The rotating shaft apparatus according to claim 1, wherein the mounting base comprises a mounting portion, a supporting portion and a connecting shaft, the supporting portion is arranged at an end of the mounting portion and defines a mounting space together with the mounting portion, the first rotating mechanism and the second rotating mechanism are arranged in the mounting space, the connecting shaft is connected to a side of the supporting portion facing towards the mounting portion, and the driving member is rotatably connected to the connecting shaft.

15. The rotating shaft apparatus according to claim 14, wherein the mounting portion is provided with a mounting groove; and the mounting groove is recessed with respect to a surface of the mounting portion and is configured for positioning the first rotating mechanism.

16. An electronic device, comprising:
   a first housing;
   a second housing; and
   a rotating shaft apparatus, wherein the rotating shaft apparatus comprises:
   a first rotating mechanism, comprising a first ratchet and a first tooth engaged with the first ratchet; the first tooth being rotatable with respect to the first ratchet in a first rotation direction, an engagement structure between the first tooth and the first ratchet making the first tooth stop rotating with respect to the first ratchet in a second rotation direction, and the second rotation direction being opposite to the first rotation direction; and
   a second rotating mechanism, coaxially arranged with the first rotating mechanism and comprising a second ratchet and a second tooth engaged with the second ratchet; the second ratchet being in stop-rotation connection with the first tooth, the second tooth being rotatable with respect to the second ratchet in the second rotation direction, and an engagement structure between the second tooth and the second ratchet making the second tooth stop rotating with respect to the second ratchet in the first rotation direction;
   wherein the rotating shaft apparatus further comprises a mounting base and a driving member, the driving member is rotatably connected to the mounting base, and the first ratchet is fixed to the mounting base, and the second tooth is in stop-rotation connection with the driving member; the mounting base is fixed with respect to the first housing, and the driving member is connected to the second housing;
   wherein the first tooth is configured to rotate, under driving of the driving member, with respect to the first ratchet in the first rotation direction, thereby changing a relative angle between the first housing and the second housing through engagement between the first tooth and the first ratchet; and the second tooth is configured to rotate, under driving of the driving member, with respect to the second ratchet in the second rotation direction, thereby changing the relative angle between the first housing and the second housing through engagement between the second tooth and the second ratchet.

17. The electronic device according to claim 16, wherein the first rotating mechanism further comprises a first rotating shaft, and the first tooth is arranged onto the first rotating shaft; the second rotating mechanism further comprises a second rotating shaft, and the second tooth is arranged onto the second rotating shaft; and the first rotating shaft and the second rotating shaft are respectively arranged at two opposite sides of the second ratchet, the first rotating shaft is in stop-rotation connection with the second ratchet; and the second rotating shaft is in rotation connection with the second ratchet;

wherein the first ratchet comprises a first peripheral wall, the first peripheral wall extends to form an accommodating space, a side of the first peripheral wall facing towards the accommodating space is provided with a plurality of positioning grooves, the first tooth is accommodated in the accommodating space, and an end portion of the first tooth is capable of being selectively accommodated in the plurality of positioning grooves;

wherein the first ratchet further comprises a first turntable portion and a plurality of positioning teeth, the first turntable portion is arranged at an end of the first peripheral wall, the first rotating shaft is rotatably connected to the first turntable portion, the plurality of positioning teeth are arranged at intervals in a circumferential direction of the first peripheral wall, and each two adjacent positioning teeth of the plurality of positioning teeth are provided a corresponding one positioning groove of the plurality of positioning grooves therebetween; and wherein the first rotating shaft comprises a stop-rotation portion and a rotating portion, the stop-rotation portion and the rotating portion are coaxially arranged and connected with each other, the rotating portion is arranged at an end of the stop-rotation portion proximate to the first turntable portion, the rotating portion is rotatably inserted into the first turntable portion, and the stop-rotation portion is in stop-rotation connection with the second ratchet.

18. The electronic device according to claim 16, wherein the mounting base comprises a mounting portion, a supporting portion and a connecting shaft, the supporting portion is arranged at an end of the mounting portion and defines a mounting space together with the mounting portion, the first rotating mechanism and the second rotating mechanism are arranged in the mounting space, the connecting shaft is connected to a side of the supporting portion facing towards the mounting portion, and the driving member is rotatably connected to the connecting shaft.

19. An electronic device, comprising: a first housing, a second housing, and a rotating shaft apparatus; the rotating shaft apparatus being connected between the first housing and the second housing; the rotating shaft apparatus comprising:
   a first rotating mechanism, comprising a first ratchet and a first tooth; the first ratchet being connected to the first housing; the first tooth being rotatably connected to the first ratchet and being rotatable with respect to the first ratchet in a first rotation direction; the first ratchet being provided with a plurality of positioning grooves in the first rotation direction; the first tooth being capable of being selectively accommodated in at least one of the plurality of positioning grooves, so as to make the first tooth stop rotating with respect to the first ratchet in a second rotation direction; and the second rotation direction being opposite to the first rotation direction; and
   a second rotating mechanism, arranged coaxially with the first rotating mechanism, and comprising a second ratchet and a second tooth engaged with the second ratchet; the second ratchet being connected to the second housing, the second ratchet being in stop-rotation connection with the first tooth; the second tooth being rotatable with respect to the second ratchet in the second rotation direction; and an engagement structure between the second tooth and the second ratchet being capable of making the second tooth stop rotating with respect to the second ratchet in the first rotation direction;

wherein the rotating shaft apparatus further comprises a mounting base and a driving member, the driving member is rotatably connected to the mounting base, and the first ratchet is fixed to the mounting base, and the second tooth is in stop-rotation connection with the driving member;

wherein the mounting base comprises a mounting portion, a supporting portion and a connecting shaft, the supporting portion is arranged at an end of the mounting portion and defines a mounting space together with the mounting portion, the first rotating mechanism and the second rotating mechanism are arranged in the mounting space, the connecting shaft is connected to a side of the supporting portion facing towards the mounting portion, and the driving member is rotatably connected to the connecting shaft.

20. The electronic device according to claim 19, wherein the first rotating mechanism further comprises a first rotating shaft, and the first tooth is arranged onto the first rotating shaft; the second rotating mechanism further comprises a second rotating shaft, and the second tooth is arranged onto the second rotating shaft; and the first rotating shaft and the second rotating shaft are respectively arranged at two opposite sides of the second ratchet, the first rotating shaft is in stop-rotation connection with the second ratchet; and the second rotating shaft is in rotation connection with the second ratchet;

wherein the first ratchet comprises a first peripheral wall, the first peripheral wall extends to form an accommodating space, a side of the first peripheral wall facing towards the accommodating space is provided with a plurality of positioning grooves, the first tooth is accommodated in the accommodating space, and an end portion of the first tooth is capable of being selectively accommodated in the plurality of positioning grooves;

wherein the first ratchet further comprises a first turntable portion and a plurality of positioning teeth, the first turntable portion is arranged at an end of the first peripheral wall, the first rotating shaft is rotatably connected to the first turntable portion, the plurality of positioning teeth are arranged at intervals in a circumferential direction of the first peripheral wall, and each two adjacent positioning teeth of the plurality of positioning teeth are provided a corresponding one positioning groove of the plurality of positioning grooves therebetween; and wherein the first rotating shaft comprises a stop-rotation portion and a rotating portion, the stop-rotation portion and the rotating portion are coaxially arranged and connected with each other, the rotating portion is arranged at an end of the stop-rotation portion proximate to the first turntable portion, the rotating portion is rotatably inserted into the first turntable portion, and the stop-rotation portion is in stop-rotation connection with the second ratchet.

* * * * *